United States Patent [19]

Jerbic

[11] Patent Number: 5,245,790
[45] Date of Patent: Sep. 21, 1993

[54] ULTRASONIC ENERGY ENHANCED CHEMI-MECHANICAL POLISHING OF SILICON WAFERS

[75] Inventor: Chris Jerbic, Fremont, Calif.

[73] Assignee: LSI Logic Corporation, Milpitas, Calif.

[21] Appl. No.: 837,444

[22] Filed: Feb. 14, 1992

[51] Int. Cl.⁵ .................. B24B 7/22; B24B 29/02
[52] U.S. Cl. ........................ 51/121; 51/122; 51/55; 51/54; 51/59 SS
[58] Field of Search ............... 51/230, 231, 121, 122, 51/317, 59 SS, 283 R, 132

[56] References Cited

U.S. PATENT DOCUMENTS

| | | | |
|---|---|---|---|
| 2,967,381 | 1/1961 | Brown | 51/59 SS |
| 3,093,937 | 6/1963 | Balamuth et al. | 51/59 SS |
| 3,841,031 | 10/1974 | Walsh | 51/283 R |
| 4,258,508 | 3/1981 | Wilson et al. | 51/283 R |
| 4,519,168 | 5/1985 | Cesna | 51/283 R |
| 4,671,851 | 6/1987 | Beyer et al. | 156/645 |
| 4,910,155 | 3/1990 | Cote et al. | 156/636 |
| 4,944,836 | 7/1990 | Beyer et al. | 156/665 |
| 5,036,015 | 7/1991 | Sandhu et al. | 51/283 R |
| 5,165,205 | 11/1992 | Nakagawa et al. | 51/230 |

Primary Examiner—Bruce M. Kisliuk
Assistant Examiner—Bryan Reichenbach
Attorney, Agent, or Firm—Gerald E. Linden; Michael D. Rostoker

[57] ABSTRACT

A technique for chemi-mechanical polishing of semiconductor wafers using ultrasonic energy is disclosed. A transducer is mounted in the polishing system, either to a platen to which the polishing pad is mounted, or to a carrier to which the semiconductor wafer is mounted. In either case, relative vibratory motion is established between the wafer and the polishing pad. The transducer may also be mounted within the reservoir containing the platen, carrier and polishing slurry, to agitate the slurry itself. By vibrating the polishing pad relative to the wafer, polish rate and repeatability are enhanced, the polishing process is less sensitive to pad use history, and the pad is somewhat self-conditioning.

5 Claims, 3 Drawing Sheets

ULTRASONIC ENERGY ENHANCED CHEMI-MECHANICAL POLISHING OF SILICON WAFERS

TECHNICAL FIELD OF THE INVENTION

The present invention relates to techniques for polishing semiconductor devices, more particularly to techniques of chemical-mechanical ("chemi-mechanical " or "chem-mech") polishing wafers.

BACKGROUND OF THE INVENTION

Chemi-mechanical polishing of semiconductor wafers is useful, at various stages of device fabrication, for planarizing irregular top surface topography, inter alia. For example, in the process of fabricating modern semiconductor integrated circuits, it is necessary to form conductive lines or other structures above previously formed structures. However, prior structure formation often leaves the top surface topography of the silicon wafer highly irregular, with bumps, areas of unequal elevation, troughs, trenches and/or other surface irregularities. As a result of these irregularities, deposition of subsequent layers of materials could easily result in incomplete coverage, breaks in the deposited material, voids, etc., if it were deposited directly over the aforementioned highly irregular surfaces. If the irregularities are not alleviated at each major processing step, the top surface topography of the surface irregularities will tend to become even more irregular, causing further problems as layers stack up in further processing of the semiconductor structure.

Depending upon the type of materials used and their intended purposes, numerous undesirable characteristics are produced when these deposition irregularities occur. Incomplete coverage of an insulating oxide layer can lead to short circuits between metallization layers. Voids can trap air or processing gases, either contaminating further processing steps or simply lowering overall device reliability. Sharp points on conductors can result in unusual, undesirable field effects. In general, processing high density circuits over highly irregular structures can lead to very poor yield and/or device performance.

Consequently, it is desirable to effect some type of planarization, or flattening, of integrated circuit structures in order to facilitate the processing of multi-layer integrated circuits and to improve their yield, performance, and reliability. In fact, all of today's high-density integrated circuit fabrication techniques make use of some method of forming planarized structures at critical points in the fabrication process.

Planarization techniques generally fall into one of several categories: chemical/mechanical polishing techniques; leveling with a filler material then etching back in a controlled environment; and various reflow techniques. Etching techniques can include wet etching, dry or plasma etching, electro-polishing, and ion milling, among others. A few less common planarization techniques exist, such as direct deposition of material into a trench by condensing material from a gaseous phase in the presence of laser light. Most of the differences between modern planarization techniques exist in the points in processing that the different techniques are applied, and in which methods and materials are used.

The present invention is directed to chemi-mechanical polishing process, which generally involves "rubbing" a wafer with a polishing pad in a slurry containing both an abrasive and chemicals. Typical slurry chemistry is KOH (Potassium Hydroxide), having a pH of about 11. Generally, polishing slurry is expensive, and cannot be recovered or reused. A typical silica-based slurry is "SC-1" available from Cabot Industries. Another, more expensive slurry based on silica and cerium (oxide) is Rodel "WS-2000".

Chemi-mechanical polishing is described in U.S. Pat. Nos. 4,671,851, 4,910,155, 4,944,836, all of which patents are incorporated by reference herein. When chemi-mechanical polishing is referred to hereinafter, it should be understood to be performed with a suitable slurry, such as Cabot SC-1.

The current state of the art in dielectric film chemi-mechanical polishing for silicon wafers typically involves the use of more than one polishing pad. For example, two pads are secured into a "stack", which may be termed a "composite polishing pad". The top pad, which performs polishing, is typically stiffer than the more compliant bottom pad, which is mounted to a rotating platen. A pressure sensitive adhesive is typically used to adhere the pads together and to the platen.

FIG. 1. shows a typical technique for chemi-mechanical polishing. A first disc-shaped pad 102 (PAD A) having a layer of pressure sensitive adhesive 104 on its back face is adhered (i.e., mounted; shown exploded) to the front face of a rotating platen 106 (PLATEN). A second disc-shaped pad 108 (PAD B) having a layer of pressure sensitive adhesive 110 on its back face is adhered (shown exploded) to the front face of the first pad 102. The platen 106 is rotated (typically at tens of revolutions per minute), and a metered stream of slurry 112 (shown as dots) from a slurry supply 114 is delivered via a slurry feed 116 to the front face of PAD B.

A silicon wafer 120 is mounted to a carrier 122 and is lightly pressed (flat) against the front surface of PAD B so that irregular topographical formations (on the pad-confronting face of the wafer) sought to be polished are acted upon by the action of PAD B and the slurry. Typically, the pads 102 and 108 and the platen 106 are on the order of 20-30 inches in diameter, the wafer is 4-6 inches in diameter, and polishing is performed in the center §portion of PAD B.

A reservoir 130 contains the platen, pads, carrier, wafer and polishing slurry.

Typical pad materials are: (1) for PAD A, foamed polyurethane; and (2) for PAD B, felt fibrules (fibers), such as polyester felt, stiffened with polyurethane resin. PAD B can also be glass-impregnated plastic. The adhesive backings 104 and 110 for the pads are typically polyurethane based. Generally, it is preferable that PAD B is stiffer than PAD A. In the case that both pads are doped with polyurethane resin, this can be achieved simply by doping PAD B with more polyurethane than PAD A.

Current chemi-mechanical polishing techniques suffer from low polish rates, poor repeatability, and sensitivity to pad use history. Pads must be "conditioned" prior to use, and during use the pads wear and change properties. The pads must be reconditioned after use, which only marginally improves polishing repeatability.

Conditioning the pad is a technique wherein the front face of the pad (e.g., PAD B) is "dressed", in a manner similar to dressing a grinding wheel. The general object is that the wafer-confronting face of the pad being conditioned is made to be planar, prior to use. Generally, such conditioning is performed "off-line", in other words separate from the polishing process.

Despite repeated conditioning of the polishing pads, polish rates may change by 20-50% during the lifetime of the pad, even with the best conditioning techniques. Such a variation introduces an undesirable variable into the polishing process.

DISCLOSURE OF THE INVENTION

It is an object of the present invention to provide improved techniques for chemi-mechanical polishing.

It is another object of the present invention to provide a technique for improving polish rate and repeatability.

It is another object of the present invention to provide a technique for reducing sensitivity to pad use history.

It is another object of the present invention to provide a technique for "on-line" conditioning of polishing pads.

According to the invention, an ultrasonic transducer introduces vibratory (mechanical) energy into the chemi-mechanical polishing process.

In one embodiment of the invention, the ultrasonic transducer is mounted to the platen upon which the pads are mounted.

In another embodiment of the invention, the ultrasonic transducer is mounted to carrier, to which the wafer being polished is mounted.

In yet another embodiment of the invention, the ultrasonic transducer is mounted to a carrier, to which the wafer being polished is mounted, and the carrier is resiliently mounted to allow for limited motion in the plane of the polishing pad.

In yet another embodiment of the invention, the transducer is simply mounted within the reservoir containing the polishing process, to vibrate the slurry.

Other objects, features and advantages of the present invention will become apparent in light of the following description thereof.

DETAILED DESCRIPTION OF THE INVENTION

Figure 1:
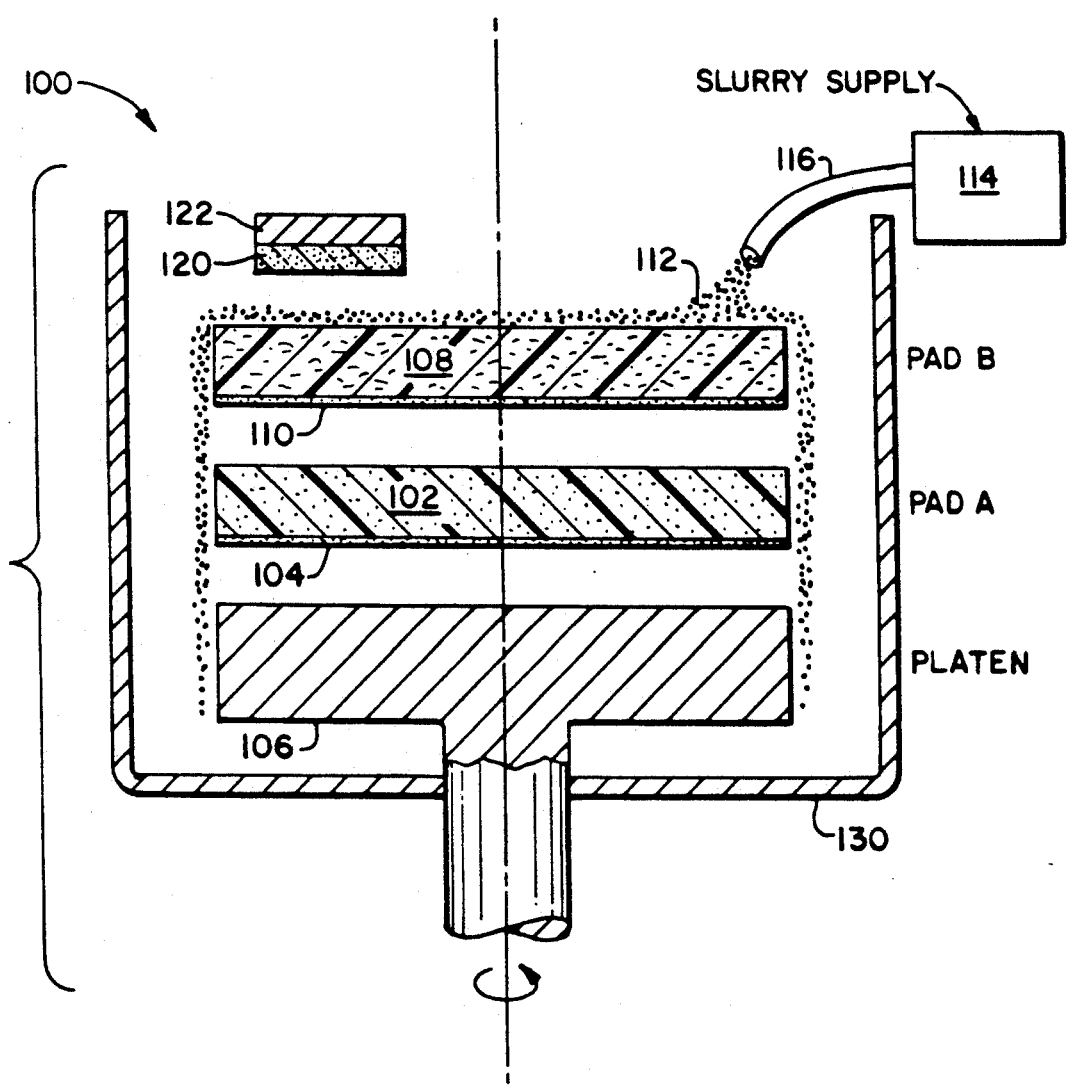
FIG. 1 is an exploded, stylized, cross-sectional view of prior art chemi-mechanical polishing apparatus.

FIG. 1 shows chemi-mechanical polishing apparatus 100 of the prior art, and has been discussed above.

As discussed above, chemi-mechanical polishing suffers from low polish rates, poor repeatability and sensitivity to pad use history, and frequent conditioning of the pads "off-line" is required.

The mechanism of chemi-mechanical polishing is the subject of ongoing inquiry, although some usable theories have evolved. Practitioners are in general agreement that the process is not strictly mechanical (abrasive) in nature, where grit in the polishing slurry simply knocks off elevated topological features on the wafer. It is also generally agreed that the process is not strictly chemical in nature, which would amount to a wet etching model. Some other, synergistic mechanism is likely active.

A useful theory for chemi-mechanical polishing is that the chemical action of the polishing slurry creates a "sol" on the wafer surface being polished. A sol is a highly hydrated material in a state just prior to going into solution. The theory continues that the mechanical action of polishing (pad rotation) may enhance sol creation by adding mechanical energy to the system, but almost certainly enhances removal of the sol from the surface of the wafer. Certainly, the mechanical action of the suspended grit (silica, silica/cesium) particles in the slurry impacting the surface of the wafer has an effect. Whatever the actual mechanism of chemi-mechanical polishing may be, the present invention demonstrably improves upon existing chemi-mechanical polishing techniques.

Figure 2

Figure 2:
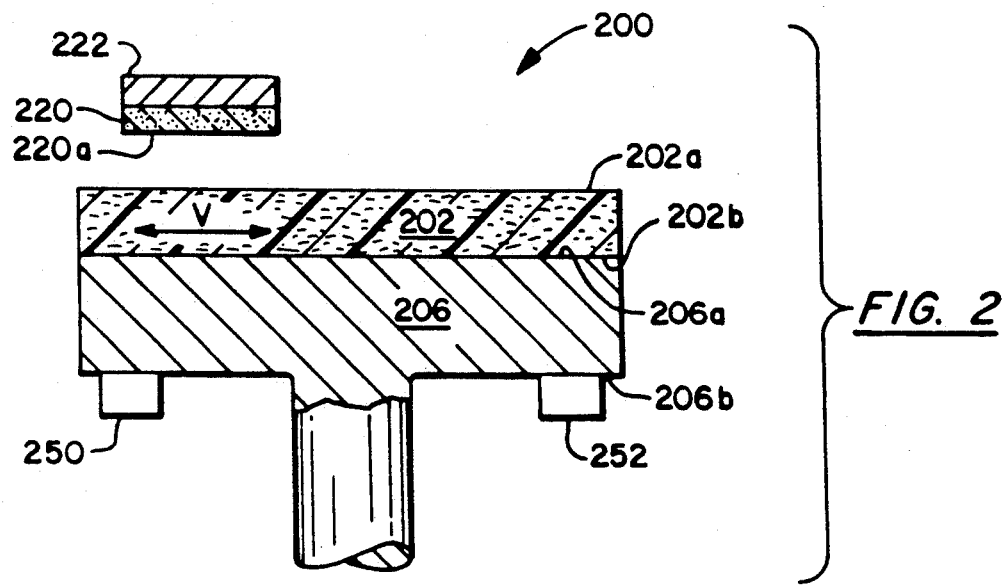
FIG. 2 is an exploded, stylized, cross-sectional view of the chemi-mechanical polishing apparatus of the present invention.

FIG. 2 shows the chemi-mechanical polishing apparatus 200 of the present invention.

In a manner consistent with the prior art, a disc-shaped polishing pad 202, which may be a composite pad (i.e., PAD A and PAD B) is mounted to a rotating platen 206. The platen has a flat front surface 206a. The pad 202 has a front face 202a oriented towards a wafer to be polished, and a back face 202b. The back face of the pad is mounted (typically adhered) to the front face of the platen.

In a manner consistent with the prior art, a silicon wafer 220 is mounted to a carrier 222. The wafer has a front face 220a containing in-process and/or completed circuit structures (i.e., layers and circuit elements). The front face of the wafer is oriented towards the front face of the pad. The platen surface 206a, pad face 202a and wafer face 220a are co-planar (but spaced apart).

In the process of chemi-mechanical polishing, a slurry is introduced to the front face of the pad (see FIG. 1), and the wafer is urged (lightly pressed) against the pad. In this manner, irregular topographical features on the front face of the wafer are removed, and the front face of the wafer becomes planarized.

According to an embodiment of the invention, a mechanical, vibratory, preferably ultrasonic (e.g., 15-30 kilohertz) transducer 250 is mounted to the underside 206b of the platen. The transducer is energized during polishing, hence "on-line". This may be accomplished with suitable slip rings, or the like, providing electrical energy from a stationary source to the rotating platen. One skilled in the art to which this invention most nearly pertains will readily understand how to energize the transducer.

Since the platen rotates at tens of rpm (revolutions per minute), the platen/transducer combination is preferably balanced. This may be accomplished by removing a suitable amount of material from the platen in the area of the transducer, or (as shown) by mounting a suitable counterweight 252 to the underside 206b of the platen at a location diametrically opposed to the transducer.

The transducer 250 is preferably oriented to establish a limited degree of pad motion (oscillation), in the plane of the platen, as illustrated by the two-headed arrow "v". Or, the transducer may be oriented to establish a limited degree of pad motion (oscillation) normal to the plane of the platen. In either case, the slurry itself, particularly the grit in the slurry, will also become agitated. These pad motions, and the agitation of the slurry, in any case, represent mechanical energy added to the system (in addition to the rotation of the platen) which improve polishing rates. It is also evident that the pad will be, to some extent, "self-conditioning" in that less frequent off-line conditioning of the pad is required. This is due, in part, to the fact that the frequency of the transducer is selected to be approximately two or more orders of magnitude (powers of ten) higher than the rotational frequency of the platen. In the example given above, the frequency of the transducer is on the order of tens of kilohertz, and the frequency of the platen is on the order of tens of hertz.

The chemi-mechanical polishing process 200 described above is performed in a suitable reservoir with a suitable supply of slurry. Compare FIG. 1.

Figure 3

Figure 3:
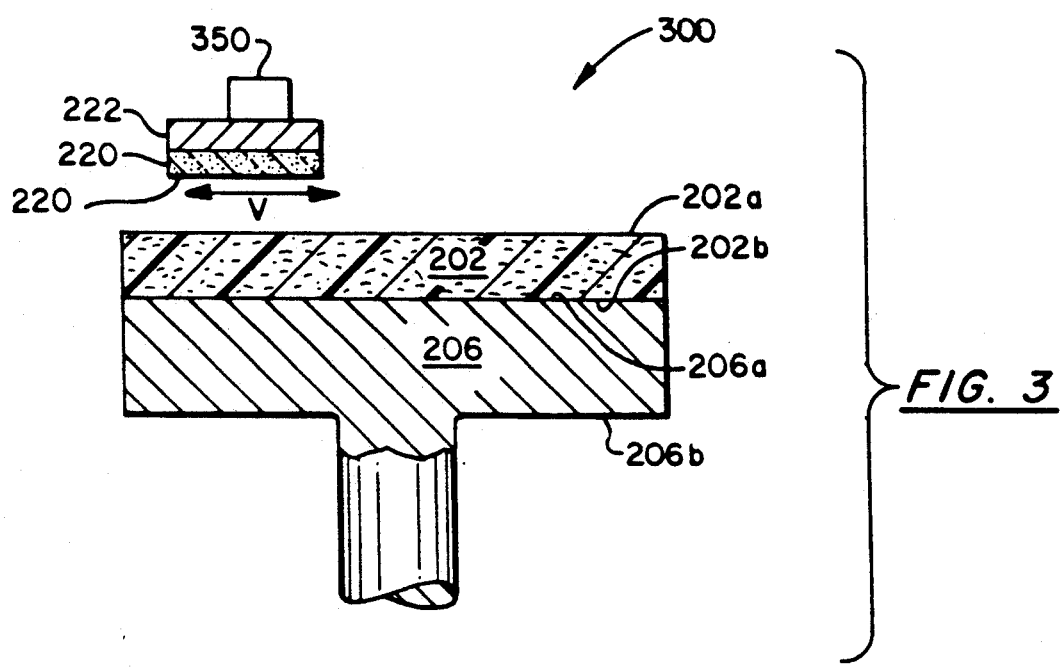
FIG. 3 is an exploded, stylized, cross-sectional view of the chemi-mechanical polishing apparatus of another embodiment of the present invention.

FIG. 3 shows an alternate embodiment 300 of the invention. In this case, the transducer 350 (comparable to the transducer 250) is mounted to the wafer carrier 222. Since the wafer carrier does not rotate, it is a simple matter to energize the transducer 350. Again, the transducer introduces an additional, discrete mechanical energy into the system, which improves etch rate and repeatability, and which tends to self-condition the polishing pad. In this case, the wafer itself oscillates. Again, the transducer is preferably oriented so that the wafer oscillates in the plane of the platen, as indicated by the two-headed arrow "v". However, the transducer can be oriented so that the wafer oscillates normal to the platen.

The chemi-mechanical polishing process 300 described above is performed in a suitable reservoir with a suitable supply of slurry. Compare FIG. 1.

Figure 4

Figure 4:
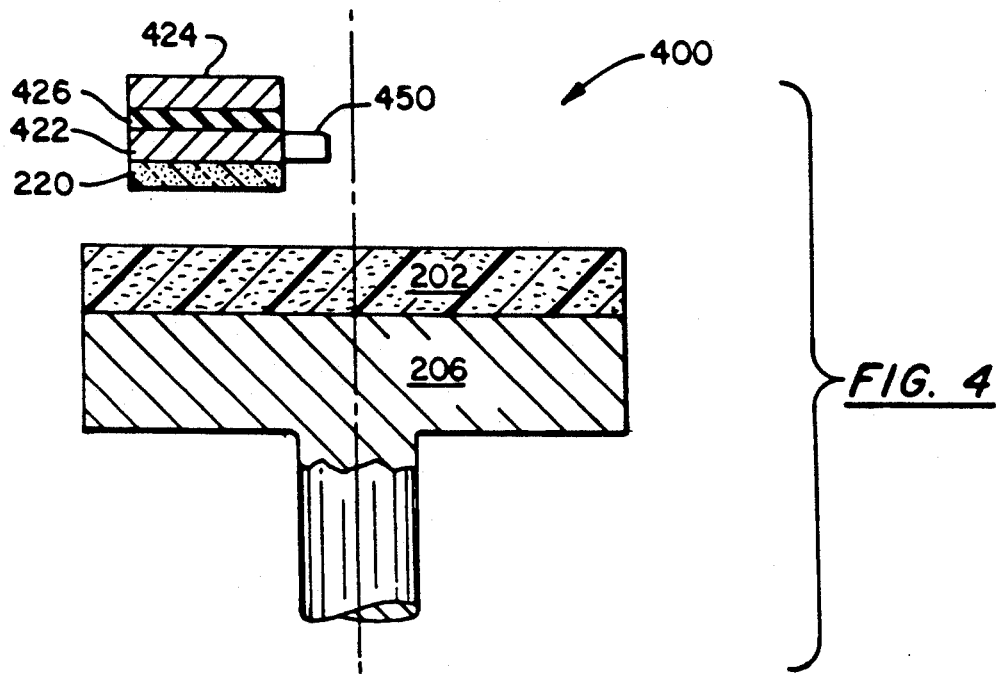
FIG. 4 is an exploded, stylized, cross-sectional view of the chemi-mechanical polishing apparatus of yet another embodiment of the present invention.

FIG. 4 shows another alternate embodiment 400 of the invention. As with the embodiment of FIG. 3, the wafer, rather than the pad, is oscillated (vibrated) by the transducer. However, in this case, the wafer 220 is mounted indirectly to a sub-carrier 424, which in turn is resiliently mounted to the carrier 422. A suitable resilient mounting is an elastomeric layer 426 disposed between the carrier 422 and the sub-carrier 424. This elastomeric mounting of the wafer has the advantage of preferably allowing movement (oscillation) of the wafer in the plane of the platen, due to the relatively low in-plane shear modulus of common elastomeric material.

In this embodiment, the transducer 450 (comparable to 250, 350) is mounted to the side of the wafer carrier 422.

The chemi-mechanical polishing process 400 described above is performed in a suitable reservoir with a suitable supply of slurry. Compare FIG. 1.

Figure 5

Figure 5:
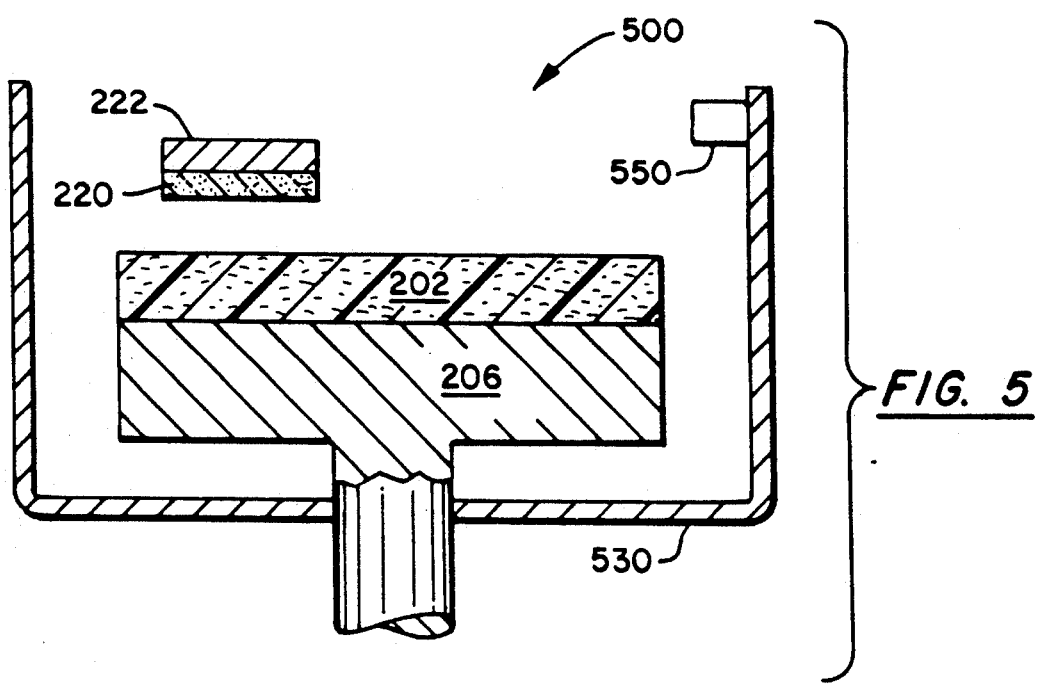
FIG. 5 is an exploded, stylized, cross-sectional view of the chemi-mechanical polishing apparatus of yet another embodiment of the present invention.

FIG. 5 shows yet another alternate embodiment 500 of the invention. In this case, the transducer 550 is disposed in the system, at any suitable location, to agitate the slurry itself. The transducer 550 (comparable to 250, 350, 450) is not mounted to the platen or to the carrier. As shown, the transducer 550 is mounted to an inner wall of the reservoir 530.

This is perhaps the simplest of the embodiments, in that the fewest modifications to existing systems are involved. However, this embodiment requires that the reservoir fill substantially with slurry, which is not the common mode of chemi-mechanical polishing. As shown more clearly in FIG. 1, chemi-mechanical polishing usually involves feeding slurry 112 to the face of the polishing pad, and letting the slurry run off, rather than accumulate.

While it is expected that polish rate will increase with this embodiment, in that the slurry itself is agitated, it is not expected to demonstrate the same degree of self-conditioning (of the pad) as in the other embodiments.

The disclosed techniques of introducing mechanical vibratory energy into the chemi-mechanical polishing system has been demonstrated to be useful in polishing oxide and glass layers on silicon wafers, and would appear to be useful in polishing tungsten films and other semiconductor structures. Polish rates and repeatability are enhanced. There is less sensitivity to pad use history. Less slurry may be consumed in the process.

In the embodiments of FIGS. 2, 3 and 4, the vibratory motion of the pad relative to the wafer (and vice-versa), causes the pad to condition itself in-situ, or "on-line".

What is claimed is:

1. Apparatus for chemi-mechanical polishing of semiconductor wafers, comprising:
   a rotating platen having a planar front face;
   at least one polishing pad mounted to the front face of the platen and rotating with the platen; the pad having a front face for polishing a wafer;
   means for delivering slurry to the front face of the pad;
   a carrier having a front surface facing the polishing pad, and a back surface facing away from the polishing pad;
   means for mounting a wafer to the pad-facing surface of the carrier; and
   means for causing relative vibration between the pad and the wafer;
   further comprising;
   a sub-carrier having a surface facing the back surface of the carrier; and
   an elastomeric layer interposed between the back surface of the carrier-facing surface of the sub-carrier for allowing movement of the wafer in the plane of the carrier;
   wherein;
   the means for vibrating is an ultrasonic transducer mounted to the carrier.

2. Apparatus, according the claim 1, wherein:
   the transducer is oriented to vibrate the wafer in the plane of the platen.

3. Apparatus, according to claim 1, wherein:
   the platen rotates at a first frequency;
   the means for vibrating is a transducer vibrating at a second frequency; and
   the second frequency is two or more orders of magnitude greater that the first frequency.

4. Apparatus according to claim 1, wherein:
   two polishing pads are provided, a first polishing pad adhered to the platen and a second polishing pad adhered to the first polishing pad.

5. Apparatus according to claim 4, wherein:
   the second polishing pad is stiffer than the first polishing pad.

* * * * *